United States Patent
Janssen et al.

(10) Patent No.: US 11,001,157 B2
(45) Date of Patent: May 11, 2021

(54) DEVICE INCLUDING A SUPPLY LINE WITH A SENSOR LINE CONFIGURED TO MEASURE A TORSION OF THE SUPPLY LINE AND A METHOD FOR MEASURING THE TORSION OF A SUPPLY LINE BASED ON A CAPACITANCE OF THE SENSOR LINE

(71) Applicant: LEONI KABEL GMBH, Nuremberg (DE)

(72) Inventors: Bernd Janssen, Friesoythe Ot Neuscharrel (DE); Rainer Poehmerer, Winkelhaid (DE)

(73) Assignee: LEONI Kabel GmbH, Nuremberg (DE)

( * ) Notice: Subject to any disclaimer, the term of this patent is extended or adjusted under 35 U.S.C. 154(b) by 151 days.

(21) Appl. No.: 16/220,675

(22) Filed: Dec. 14, 2018

(65) Prior Publication Data
US 2019/0120706 A1    Apr. 25, 2019

Related U.S. Application Data

(63) Continuation of application No. PCT/EP2017/062490, filed on May 24, 2017.

(30) Foreign Application Priority Data

Jun. 15, 2016    (DE) .......................... 102016210615.5

(51) Int. Cl.
*G01L 1/14*      (2006.01)
*B60L 53/14*     (2019.01)
(Continued)

(52) U.S. Cl.
CPC ............ *B60L 53/14* (2019.02); *G01D 5/2417* (2013.01); *G01L 1/14* (2013.01); *G01L 1/142* (2013.01);
(Continued)

(58) Field of Classification Search
None
See application file for complete search history.

(56) References Cited

U.S. PATENT DOCUMENTS 6,601,462 B1    8/2003  Ueno et al.
8,598,457 B2   12/2013  Schramm et al.
(Continued)

FOREIGN PATENT DOCUMENTS

DE         10324919 A1    1/2004
DE     102007022039 A1   11/2008
(Continued)

OTHER PUBLICATIONS https://en.wikipedia.org/wiki/Silicone_rubber, Silicon Rubber, Wikipedia The Free Encyclopedia, Properties and Special grades sections. (Year: 2020).*

*Primary Examiner* — Lisa M Caputo
*Assistant Examiner* — Nigel H Plumb
(74) *Attorney, Agent, or Firm* — Laurence A. Greenberg; Werner H. Stemer; Ralph E. Locher

(57) ABSTRACT

A device has two machine parts that are movable relative to one another and are connected to each other by a supply line, along which a sensor line is mounted for measuring torsion of the supply line. The sensor line includes two conductors forming a conductor pair, which is stranded during production. The two conductors form a capacitor with a capacitance depending on the spacing between the two conductors. Depending on the direction of torsion of the supply line, the spacing between the two conductors is enlarged or reduced.

(Continued)

The sensor line is connected to a measurement unit which is configured in such a way that a capacitance of the sensor line is measured, the torsion being ascertained using the capacitance.

8 Claims, 1 Drawing Sheet

(51) Int. Cl.
    *G01D 5/241*     (2006.01)
    *H01B 7/32*     (2006.01)
    *G01M 5/00*     (2006.01)
    *G01L 5/10*     (2020.01)
    *G01L 3/00*     (2006.01)
    *G01R 31/58*     (2020.01)
    *G01L 5/101*     (2020.01)

(52) U.S. Cl.
    CPC ................. *G01L 3/00* (2013.01); *G01L 5/10* (2013.01); *G01L 5/101* (2013.01); *G01M 5/0025* (2013.01); *G01M 5/0041* (2013.01); *G01R 31/58* (2020.01); *H01B 7/328* (2013.01); *Y02T 10/70* (2013.01); *Y02T 10/7072* (2013.01); *Y02T 90/14* (2013.01)

(56) References Cited

U.S. PATENT DOCUMENTS

| | | |
|---|---|---|
| 2002/0079905 A1 | 6/2002 | Brown |
| 2006/0196252 A1 | 9/2006 | Deckard |
| 2009/0236120 A1 | 9/2009 | Wiebelhaus et al. |
| 2011/0037483 A1 | 2/2011 | Scheuermann et al. |
| 2012/0277531 A1 | 11/2012 | Krattiger et al. |
| 2014/0177862 A1 | 6/2014 | Jensen et al. |

FOREIGN PATENT DOCUMENTS

| | | |
|---|---|---|
| DE | 102012007892 A1 | 10/2012 |
| EP | 2495733 A1 | 9/2012 |
| EP | 2746729 A1 | 6/2014 |
| JP | S61292530 A | 12/1986 |
| JP | 2000162121 A | 6/2000 |
| JP | 2001074405 A | 3/2001 |
| JP | 2001153737 A | 6/2001 |
| JP | 2006032060 A | 2/2006 |
| KR | 200270406 Y1 | 3/2002 |
| KR | 1020120101303 | 9/2012 |
| WO | 2012164703 A1 | 12/2012 |
| WO | 2016036261 A1 | 3/2016 |

\* cited by examiner

DEVICE INCLUDING A SUPPLY LINE WITH A SENSOR LINE CONFIGURED TO MEASURE A TORSION OF THE SUPPLY LINE AND A METHOD FOR MEASURING THE TORSION OF A SUPPLY LINE BASED ON A CAPACITANCE OF THE SENSOR LINE

CROSS-REFERENCE TO RELATED APPLICATION

This is a continuation application, under 35 U.S.C. § 120, of copending international application No. PCT/EP2017/062490, filed May 24, 2017, which designated the United States; this application also claims the priority, under 35 U.S.C. § 119, of German patent application No. DE 10 2016 210 615.5, filed Jun. 15, 2016; the prior applications are herewith incorporated by reference in their entirety.

BACKGROUND OF THE INVENTION

Field of the Invention

The invention relates to a device, a supply line for a device of this type, and a sensor line and a method for measuring the torsion of the supply line.

A supply line is used to connect two machine parts and to transmit energy, signals and/or working media between the two machine parts. The two machine parts are frequently movable relative to each other, so that the supply line is in particular subjected to repeated mechanical loadings, especially torsional loadings but also, for example, bending loadings. Particularly high requirements with respect to the flexibility of such a supply line result in the robots sector, for example robot arms in fabrication. Supply lines are also often potentially highly stressed in the automotive sector.

It is critical overall in this use that the supply line tolerates only a specific extent of deformation, in particular torsion as a result of the construction, and there is the danger of a functional failure in the event of over-stressing. In principle, it is possible to guide the supply line positively over a rigid guide contour or a limited-movement mechanism, i.e. to guide said supply line only along a predetermined path, and to restrict the movement to specific fixing points, e.g. pivots. At these fixing points, the torsional loading can then be measured by conventional sensors. The occasionally regular positional change and repeated deformation of the supply line is particularly complex in the areas of use mentioned at the beginning, however, and often a high degree of variability is demanded. A measurement of the torsional loading in the case of non-positively guided supply lines is however not possible with conventional sensors.

SUMMARY OF THE INVENTION

Against this background, it is an object of the invention to permit reliable monitoring or measurement of the torsion in such stressed, in particular non-positively guided, supply lines. To this end, a device having a supply line is to be specified, the torsion of which is measurable and is measured as simply and flexibly as possible. The supply line itself is in this case to be as far as possible freely movable. Furthermore, the intention is for a torsion measurement to be carried out in particular not only point by point but by taking the entire supply line into account. In addition, the intention is to specify a corresponding supply line and a sensor line and a method for measuring the torsion of the supply line.

According to the invention, the object is achieved by a device having the features as claimed in the main device claim. In addition, the object is achieved by a supply line having the features as claimed in main supply line claim, by a sensor line having the features as claimed in main sensor line claim and by a method having the features as claimed in the main method claim. Advantageous refinements, developments and variants are the subject matter of the sub-claims. Here, the explanations in conjunction with the device also apply in the same sense to the supply line, the sensor line and the method and vice versa.

The device generally has two machine parts, which are movable relative to each other and which are connected to each other by a supply line. The supply line itself usually has a number of supply strands, that is to say one or more, via which one of the two machine parts is supplied. In addition to the supply strands, the supply line additionally has a sensor line for measuring the torsion of the supply line, i.e. for measuring a rotation of the supply axis about a (central) longitudinal axis of the same. Here, the sensor line is connected to a measuring unit, which is formed in such a way that an electric parameter of the sensor line is measured and that, by means of the parameter, a conclusion is drawn at least about the torsion. From the measured value of the parameter, a characteristic variable for the current torsional loading is therefore derived and the torsion is thereby determined at least indirectly. In particular, the torsion of the supply line along its in particular entire length between the two machine parts is determined in this case.

The invention is based in particular on the observation that a torsional measurement is conventionally possible only point by point by attaching a torsion sensor. The supply line must then be positively guided, for example, in order to be loaded only in a specific way, so that a measurement of the torsion at specific fixing points is possible. Alternatively, a corresponding number of sensors must be arranged to be distributed along the supply line, as a result of which the measurement is particularly complicated from a constructional point of view. By contrast, it has been recognized that the electrical properties of a line with a suitable structure change in a measurable way during a movement and/or deformation, so that a corresponding line can advantageously be used as a sensor line. A substantial advantage of the invention thus consists in particular in the fact that specific torsion sensors are dispensed with and instead a suitable sensor line is used as a torsion sensor. This means that the sensor line is not a feed line to a sensor but is itself a sensor, more precisely a torsion sensor. The torsion is therefore measured by means of the sensor line not point by point but over relatively great longitudinal sections of typically several tens of centimeters up to several meters, in particular over the entire length of the sensor line.

The measurement of the electric parameter of the sensor line is important for the determination of the torsion. One characteristic of this parameter is that it changes, depending on torsion of the sensor line. Since the sensor line is coupled mechanically to the supply line, torsion of the supply line also results in preferably identical torsion of the sensor line. The latter in turn has specific transmission properties, which are characterized by the parameter. The change in the parameter thus corresponds in particular to a change in the transmission properties of the sensor line, which means that a measurement of the transmission properties is carried out by measuring the parameter. Expediently, therefore, to measure the parameter, an electric test signal is applied to the sensor line or fed into the latter, and the transmission properties are determined by using the change in the test signal. To this end, the sensor line is connected to the measuring unit, which provides a suitable test signal and in particular measures the change thereof. The measuring unit measures the parameter and also preferably evaluates the measurement, e.g. by comparison with previously measured values of the parameter. With the measurement of the parameter, the measuring unit then ultimately determines the torsion of the sensor line and therefore also the torsion of the supply line.

The principle of measuring the torsional loading of the supply line is therefore based generally on the fact that, as a result of the integration of the sensor line in the supply line, the sensor line is also subjected to torsional stress, which leads to a mechanical change in the structure of the sensor line, as a result of which the transmission properties for a (sensor) signal transmitted via the sensor line change and, as a result, lead to a characteristic change in the signal. By using this characteristic change in the signal, conclusions about the torsional loading are then drawn by means of the measuring unit.

Preferably, the sensor line is designed to be mechanically robust, for the multiple measurement of the torsion, in particular a critical torsion which is not to be exceeded. "Mechanically robust" is understood in particular to mean that the sensor line does not break under torsional stress. The sensor line is accordingly in particular not conceived as a sacrificial line but as a mechanically robust sensor line. An important advantage is in particular that the sensor line must not be designed as the weakest element of the supply line which breaks under a specific amount of loading and, as a result, induces specific torsional stress. Instead, the sensor line can advantageously be used many times in order to detect specific critical torsional stresses many times.

The sensor line is arranged along the supply line and is connected to the latter, so that the sensor line consequently is subjected to the same or at least similar loadings as the supply line. By measuring the electric parameter, i.e. one of the electric properties of the sensor line, the deformation of the sensor line itself and, with the latter, also the deformation of the supply line are then measured in a particularly simple way. During the measurement, because of the principle, the course of the entire sensor line is taken into account here and, accordingly, an elongated and in particular continuous section of the supply line. The sensor line preferably runs along the entire supply line, so that the torsion of the same overall is measured. Alternatively, however, the torsion is measured only in some sections and, for this purpose, the sensor line is attached only in some sections along the supply line.

The sensor line is part of the supply line and is connected mechanically to the latter. In particular, it forms a composite with the individual supply strands of the supply lines, which composite is preferably surrounded by a common outer sheath.

By means of the sensor line, in particular torsions in the region of greater than one complete revolution of the supply line about its longitudinal axis per running meter of the supply line as far as 20 revolutions per meter can be measured. In principle, however, also fewer or more revolutions are measurable with the sensor line described here. The measuring range is primarily determined here by the specific design and the dimensioning of the sensor line. By means of appropriate adaptation of the sensor line, it is thus possible to adapt the torsion measurement optimally to the existing application.

The supply line is primarily used for the transmission of energy, signals and/or working media between the two machine parts. The individual supply strands of the supply line are therefore, optionally or in any desired application-dependent combinations, a power cable for the power supply of the machine part, a data cable, a hose, for example a hydraulic or pneumatic hose for supplying the machine part with a hydraulic fluid, an operating or lubricating agent, with a gas or with compressed air. In addition, a hybrid cable, a wiring harness, can be used as supply strands. The supply strands are usually surrounded by a hose, in particular in the robotics sector, and form a hose pack. The machine parts do not necessarily additionally have to be coupled to each other but nevertheless can be connected to each other, for example via a joint. The machine parts are, for example, two parts of a robot, for example a base and a manipulator movable relative hereto. The supply line here feeds, for example, energy and control signals to the manipulator. In a variant, the two machine parts are a vehicle and an in particular electric charging station, and the supply line is a charging cable for transmitting electric energy to an energy store of the vehicle.

In general terms, the two machine parts are movable relative to each other in such a way that torsion, i.e. rotation of the supply line, takes place or is at least possible. In particular, the torsion is measured within the context of online monitoring, continuously or at regular time intervals. On the basis of and depending on the measured torsion, for example a warning signal is then output if the supply line is rotated beyond a predefined limit. Alternatively or additionally, the measured torsion is used for wear forecasts, i.e. the torsion is measured regularly and in particular stored in a memory of the measuring unit, in order to monitor the actual use and therefore the wear of the supply line.

The measuring unit expediently has a suitable evaluation circuit, in order to determine the torsion on the basis of the measured capacitance. Both analog and digital approaches are suitable for this purpose. The measured capacitance is converted, for example via a table, into torsion of the supply line in degrees or revolutions per meter or is used directly as a value for the torsion.

In a preferred refinement, the sensor line has two conductors, which form a conductor pair. Here, the parameter is a capacitance of the conductor pair. This is based in particular on the finding that the two conductors form a capacitor with a capacitance which depends on the spacing between the two conductors. In the event of torsion of the conductor pair, the latter is rotated correspondingly and the spacing between the conductors changes, in particular the conductors move closer to each other. By measuring the torsion-dependent capacitance, the torsion of the sensor line and thus of the supply line can be determined in a simple way. The conductors in this case do not necessarily have to be designed as stranded conductors but are expediently solid individual wires, the individual transmission properties of which are then in particular not affected by the torsion. Instead, a transmission property and thus an electric parameter of the conductor pair per se are measured.

The two conductors generally form a transmission pair for a sensor signal. In general, the conductors are each surrounded by an insulating sheath and each form, for example, one lead. With regard to as undisturbed as possible a transmission of the sensor signals, the transmission pair is arranged suitably relative to each other. The transmission pair can generally be formed as a twisted or untwisted pair and with or without pair shielding.

If two parallel conductors are used, the capacitance changes equally in both torsional directions as a result of the principle. In an advantageous variant, to determine the direction of the torsion, the conductor pair is thus stranded during production, so that rotation and thus an enlargement of the spacing are also possible. Depending on the direction of the torsion, the spacing is then enlarged or reduced.

The measuring unit is expediently formed as a capacitance measuring unit to measure the capacitance. For example, the measuring unit provides an alternating voltage as test signal via a two-pole connection, which alternating voltage is applied to the conductor pair. By measuring the response behavior of the conductor pair, the capacitance is then determined. The torsion is then in turn determined, for example, by an assignment by means of a stored table. In particular, signals having a frequency in the range from 0 to 100 kHz are suitable as a test signal.

In order in particular to permit suitable deformation of the sensor line and a change in the spacing of the conductors during the torsion, in a preferred refinement a soft material, which is compressed or widened in the event of torsion of the cable, is arranged between the two conductors. Here, in particular foamed plastics are suitable as the material. For example, the sensor line has a profile or profiled element, in which the conductors are embedded, wherein the profiled element has a core element which is then arranged between the two conductors. At least the core element is then made of the soft material. The profile is, for example, approximately H-shaped or double-V-shaped.

In a suitable refinement, the soft material has a Shore-A hardness in the range from 10 to 30. In practical terms, however, the optimal hardness depends on the dimensions of the sensor line. For example, a flexible foam, e.g. made of PUR, is suitable. In any case, the material is preferably chosen such that a geometrical change caused by torsion is reversible. Such a material is sufficiently soft in order to ensure a suitable change in the spacing of the conductors relative to each other in the event of torsion.

The two conductors are expediently jointly embedded in a profile made of an insulating material and spaced apart from one another by means of the profile. In particular, the insulating material at the same time forms a common sheathing or a line sheath of the two conductors. Plastics, for example PE, PP, PVC or PA, are primarily suitable as the material. The aforementioned web of soft material is expediently formed by the profile and is then in particular a constituent part of the same.

In an advantageous refinement, the two conductors are each formed as coaxial conductors, i.e. individually provided with a dielectric and shielding. As a result, the transmission properties are more defined and disruptive influences from the surroundings are effectively shielded.

In order in particular to protect the conductors overall from environmental influences, above all electrical interference, in a suitable refinement both conductors are surrounded by a common shielding. As a result, the conductors of the sensor line are advantageously shielded with respect to other lines of the supply line, even in an overall composite with the supply line.

For the configuration of the sensor line, in general terms—taking account of the preceding requirements for the desired evaluation of the torsional loading—recourse may be had to conventional configurations in the case of data lines. The sensor line can also be integrated into a (data) line composite, for example a (four-way) stranded composite. Furthermore, there is also the possibility of using the sensor line also for additional data transmission and/or transmission of a supply voltage or an electric output. In the last-named case, the sensor signal is, for example, modulated on.

Other features which are considered as characteristic for the invention are set forth in the appended claims.

Although the invention is illustrated and described herein as embodied in a device, supply line for a device of said type, a sensor line, and a torsion measurement method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
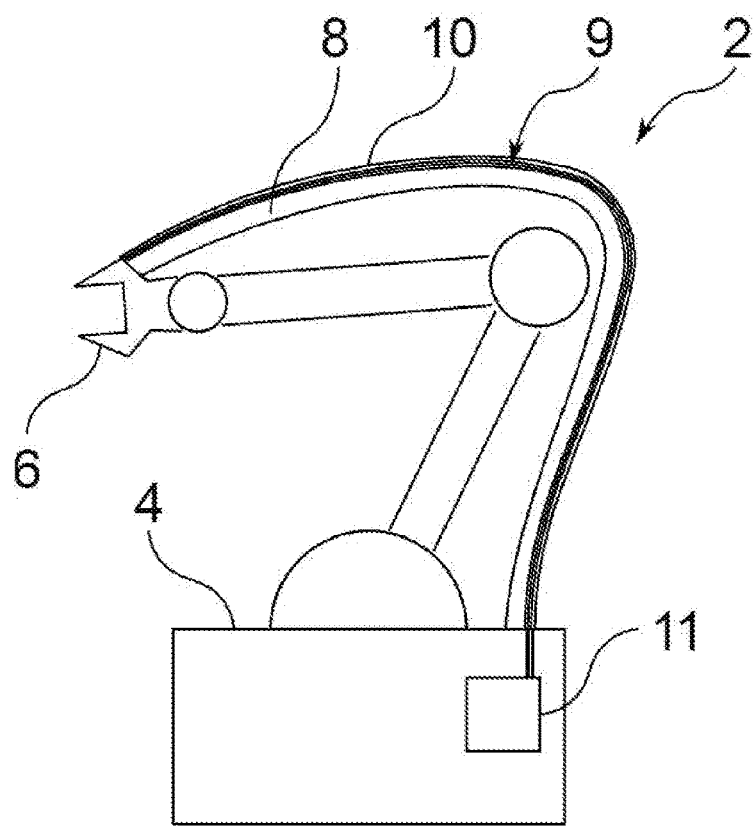
FIG. 1 is an illustration of a device having a supply line and a sensor line.

Referring now to the figures of the drawings in detail and first, particularly to FIG. 1 thereof, there is shown a device 2 which, here, is a robot. The device 2 has two machine parts 4, 6, here a base 4 and a manipulator 6. The machine parts 4, 6 are connected to each other by a supply line 8. In order to transmit energy, data, signals and/or working media, the line 8 usually has multiple supply strands 9, in particular different types of supply strands 9, in the form of electric, hydraulic or pneumatic lines, etc. In FIG. 1, by means of the supply line 8, for example control signals are transmitted from the base 4 to the manipulator 6. In a variant not shown, the two machine parts 4, 6, are for example, a vehicle and an electric charging station, and the supply line 8 is a charging cable for charging an energy store of the vehicle.

The machine parts 4, 6 are movable relative to each other and, accordingly, the supply line 8 is also to be movable as flexibly as possible. As a result, under certain circumstances complex mechanical loadings of the supply line 8 result, in particular including torsion, i.e. rotation. The torsion of the supply line 8 is determined by a sensor line 10, which is part of the supply line 8 and as a result is coupled mechanically to the supply strands 9. In the event of torsion of the supply line 8, the sensor line 10 is accordingly likewise rotated. The sensor line 10, together with the further supply strands 9, is preferably surrounded by a common outer sheath of the supply line 8 or, alternatively, is also fitted to the outside of such an outer sheath or else to a supply strand.

The sensor line 10 itself serves as a sensor, specifically as a torsion sensor, so that torsion between the two machine parts 4, 6 can be determined not just point by point but along the entire supply line 8. The sensor line 10 has transmission properties which depend on torsion of the sensor line 10. These transmission properties are characterized by at least one electric parameter, which is measured by a measuring unit 11. For this purpose, a test signal is fed into the sensor line 10 by the measuring unit 11 and, in particular, the change in the test signal on account of changed transmission properties is examined.

Figure 2:
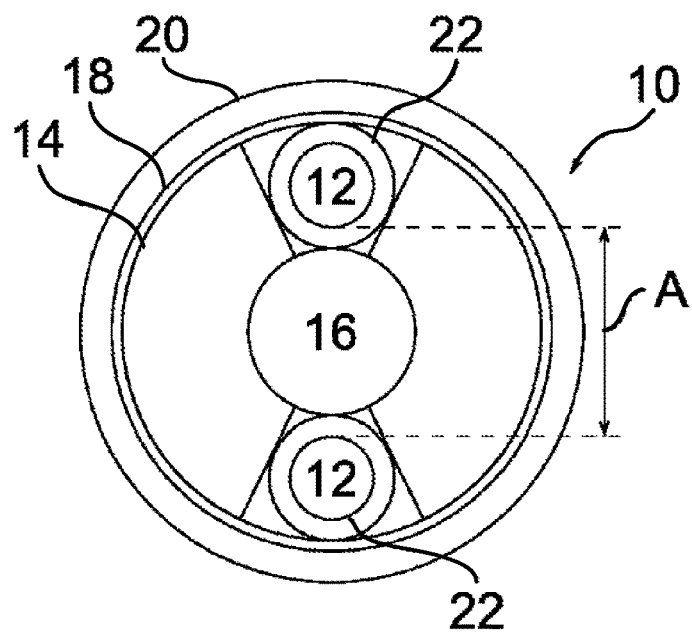
FIG. 2 is an end view of the sensor line.

One exemplary embodiment of the sensor line 10 is illustrated in FIG. 2 in cross section at right angles to the longitudinal direction of the sensor line 10. The latter has two conductors 12, by means of which the measurement of the torsion is carried out. The two conductors 12 are spaced apart from each other at a spacing A. In the event of torsion of the sensor line 10, the two conductors 12 are rotated relative to each other, and the spacing A is changed. Starting from two parallel conductors 12, the spacing A is reduced. In one variant, the two conductors 12 are already stranded with each other in an initial position, so that torsion in one direction effects a reduction in the spacing and torsion in another direction an enlargement in the spacing. The two conductors 12 are embedded in a profile 14 which has a core element 16. The core element 16 is arranged between the conductors 12 and predefines the spacing A. In order to permit a change in the spacing A, the core element 16 is made of a soft and thus deformable material. As a result, the core element 16 can be compressed or pulled apart.

The torsion measurement is based on the finding that the two conductors 12 form a capacitor with a capacitance which depends on the spacing A and thus on the torsion. Accordingly, the measuring unit 11 is then expediently formed as a capacitance measuring unit and measures the capacitance of the conductor pair as an electric parameter. With the aid of the measured capacitance, the torsion is then determined.

The sensor line 10 of FIG. 2 additionally has a shielding 18, which surrounds the two conductors 12 and shields them from disruptive influences from outside. A line sheath 20 is arranged around the shielding 18. The conductors 12 are each surrounded by an insulating sheath 22. In a variant not shown, the conductors 12 are not each surrounded by an insulating sheath 22. In a variant likewise not shown, the two conductors 12 are formed as coaxial conductors and then, alternatively or additionally to the shielding 18, each have their own shielding.

The invention claimed is:

1. A device, comprising:
   a supply line having a sensor line for measuring a torsion of said supply line;
   two machine parts, with one part of the two machine parts being movable relative to the other part of the two machine parts, said two machine parts connected to each other by said supply line;
   said sensor line having two conductors, forming a conductor pair, and forming a capacitor with a capacitance that depends on a spacing between said two conductors;
   a soft material arranged between said two conductors to permit a change in the spacing between said two conductors during the torsion, said soft material being compressed in the event of torsion of the sensor line in a first direction and widened in the event of torsion of the sensor line in a second, different direction;
   said conductor pair being stranded during production in order to determine the direction of the torsion, such that depending on the direction of the torsion, the spacing between said two conductors is enlarged or reduced; and
   a measuring unit connected to said sensor line, said measuring unit being formed in such a way that said capacitance of said sensor line is measured and that conclusions about the torsion are drawn from said capacitance.

2. The device according to claim 1, wherein said sensor line is configured to be mechanically robust for multiple measurements of the torsion.

3. The device according to claim 1, wherein said soft material has a Shore-A hardness in a range from 10 to 30.

4. The device according to claim 1, further comprising an insulating material and said two conductors are jointly embedded in a profile made of said insulating material and are spaced apart relative to each other by means of said insulating material.

5. The device according to claim 1, wherein said two conductors are each formed as coaxial conductors.

6. The device according to claim 1, wherein said sensor line has a common shielding surrounding said two conductors.

7. A method for measuring a torsion, which comprises the steps of:
   providing a sensor line having two conductors, forming a conductor pair, and forming a capacitor with:
      a capacitance that depends on the spacing between the two conductors;
      a soft material arranged between the two conductors to permit a change in the spacing of the conductors during torsion, the soft material being compressed in the event of torsion of the sensor line in a first direction and widened in the event of torsion of the sensor line in a second, different direction; and
      the conductor pair being stranded during production, in order to determine a direction of the torsion, such that, depending on the direction of the torsion, the spacing between the two conductors is enlarged or reduced;
   providing a measuring unit, which provides an electric test signal;
   applying to the sensor line, or feeding into the sensor line, the electric test signal;
   measuring the capacitance by measuring a response behavior of the conductor pair to the electric test signal and using the measured response behavior to determine the capacitance; and
   determining, with the measuring unit, the torsion of the supply line using the measured capacitance.

8. A method for using a sensor line to measure a torsion, the method comprising the steps of:
   providing a sensor line including:
      two conductors, forming a conductor pair, the two conductors forming a capacitor with a capacitance that depends on the spacing between the two conductors,
      a soft material arranged between the two conductors to change the spacing of the conductors during torsion, the soft material being compressed in the event of torsion of the sensor line in a first direction and widened in the event of torsion of the sensor line in a second, different direction, and
      the conductor pair being stranded during production in order to determine a direction of the torsion, such that, depending on the direction of the torsion, the spacing between the two conductors is enlarged or reduced;
   connecting a measuring unit to the sensor line, the measuring unit configured to provide an electric test signal;
   measuring the capacitance of the capacitor by:
      with the measuring unit, applying the electric test signal to the sensor line, or feeding the electric test signal into the sensor line;
      measuring a response behavior of the conductor pair to the electric test signal;

determining the capacitance from the measured response behavior of the conductor pair; and
determining, with the measuring unit, the torsion of the supply line using the measured capacitance.

* * * * *